United States Patent
Rahman et al.

(10) Patent No.: US 10,386,876 B2
(45) Date of Patent: Aug. 20, 2019

(54) HIGH CURRENT LIMIT TRIM APPARATUS AND METHODOLOGY

(71) Applicant: TEXAS INSTRUMENTS INCORPORATED, Dallas, TX (US)

(72) Inventors: Md. Abidur Rahman, Richardson, TX (US); Sualp Aras, Dallas, TX (US); Tri Cao Nguyen, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 184 days.

(21) Appl. No.: 15/231,472

(22) Filed: Aug. 8, 2016

(65) Prior Publication Data

US 2017/0038784 A1    Feb. 9, 2017

Related U.S. Application Data (60) Provisional application No. 62/202,411, filed on Aug. 7, 2015.

(51) Int. Cl.
| | | |
|---|---|---|
| *G05F 1/573* | (2006.01) | |
| *G05F 1/571* | (2006.01) | |
| *G01R 31/28* | (2006.01) | |
| *H02H 3/08* | (2006.01) | |
| *H02H 9/02* | (2006.01) | |
| *H02H 3/087* | (2006.01) | |
| *G05F 1/569* | (2006.01) | |
| *H02H 3/20* | (2006.01) | |
| *H02H 3/00* | (2006.01) | |

(52) U.S. Cl.
CPC .......... *G05F 1/571* (2013.01); *G01R 31/2827* (2013.01); *H02H 3/08* (2013.01); *G05F 1/569* (2013.01); *G05F 1/573* (2013.01); *H02H 3/006* (2013.01); *H02H 3/087* (2013.01); *H02H 3/20* (2013.01); *H02H 9/02* (2013.01)

(58) Field of Classification Search
USPC .................................. 361/86–87, 93.7–93.9
See application file for complete search history.

(56) References Cited

U.S. PATENT DOCUMENTS

| | | | | |
|---|---|---|---|---|
| 7,015,680 | B2* | 3/2006 | Moraveji ................ | G05F 1/565 323/274 |
| 8,699,195 | B2* | 4/2014 | So .......................... | G05F 1/573 361/93.2 |
| 2009/0097178 | A1* | 4/2009 | Krishnan ................ | H03F 1/523 361/86 |
| 2012/0098517 | A1* | 4/2012 | Esumi ................ | H03K 17/0822 323/311 |
| 2012/0268852 | A1* | 10/2012 | Rogoff .................... | G05F 1/573 361/93.4 |

* cited by examiner

*Primary Examiner* — Danny Nguyen
(74) *Attorney, Agent, or Firm* — Lawrence J. Bassuk; Charles A. Brill; Frank D. Cimino (57) ABSTRACT

A circuit protective system. The system has: (i) an input for sensing an operational voltage responsive to a current flowing through a transistor; (ii) circuitry for applying a forced voltage at the input; (iii) voltage-to-current conversion circuitry for outputting a reference current in response to the forced voltage at the input; (iv) circuitry for providing a reference trim current in response to a trim indicator; and (v) comparison circuitry for outputting a limit signal in response to a comparison of the reference current and the reference trim current.

18 Claims, 4 Drawing Sheets

HIGH CURRENT LIMIT TRIM APPARATUS AND METHODOLOGY

CROSS-REFERENCES TO RELATED APPLICATIONS

This application claims priority to, the benefit of the filing date of, and hereby incorporates herein by reference, U.S. Provisional Patent Application 62/202,411, entitled "MCM Ultra-High Current-Limit Test and Trim Procedure," and filed Aug. 7, 2015.

STATEMENT REGARDING FEDERALLY SPONSORED RESEARCH OR DEVELOPMENT

Not Applicable.

BACKGROUND OF THE INVENTION

The preferred embodiments relate to electronic power driven systems, such as those driven with power field effect transistors (FETs).

Certain electronically-driven power devices have high transient demands, such as at cold start-up, which tend toward requiring high current flow to meet the device (or customer) demands. For example, in automotive module applications, such as energizing an incandescent bulb coil at cold temperatures, very high peak in-rush current may be required to initially drive the coil, such as current demands in the range of approximately 90 A to 100 A. Typically, a high-side power FET is used as a switch to allow this much current to flow, and in order to meet the high demands.

High current flow can cause stress, damage, and fault violations to power driving circuitry, including one or more FETs. Thus, certain prior art approaches have evolved in an effort to allow the FET to source sufficient current for the application (e.g., 90 A to 100 A as described above), while at the same time limiting current flow so as not to unduly exceed the needed current, in order to protect the device against potential damage. In a prior art approach, therefore, current through the FET is monitored, and, if the current exceeds a threshold, a protection function is taken that disables the transistor gate potential, thereby disabling the transistor and ending the flow of excessive current. In this approach, therefore, the monitoring circuit must allow the FET to provide sufficient current without triggering the protective action. However, due to certain factors, such as process variations and mismatch of devices, the current threshold needs to be set or "trimmed" to achieve that threshold with acceptable accuracy. Further, trimming a current limit to 90 A or higher in automatic test equipment (ATE) for production is very demanding in terms of hardware and reliability of the part.

Given the preceding, while the prior art approaches may be acceptable in certain implementations, some applications may have requirements that are not satisfactorily met with these prior art approaches. Hence, an accurate apparatus and method for testing, trimming, and implementing a FET and controller with a very high-value current-limit, yet using low current calibration, is very valuable for test and production and is needed. The present inventors, therefore, endeavor to provide such apparatus and method, as further detailed below.

BRIEF SUMMARY OF THE INVENTION

In a preferred embodiment, there is a circuit protective system. The system comprises: (i) an input for sensing an operational voltage responsive to a current flowing through a transistor; (ii) circuitry for applying a forced voltage at the input; (iii) voltage-to-current conversion circuitry for outputting a reference current in response to the forced voltage at the input; (iv) circuitry for providing a reference trim current in response to a trim indicator; and (v) comparison circuitry for outputting a limit signal in response to a comparison of the reference current and the reference trim current.

Numerous other inventive aspects are also disclosed and claimed.

DETAILED DESCRIPTION OF EMBODIMENTS

Figure 1:
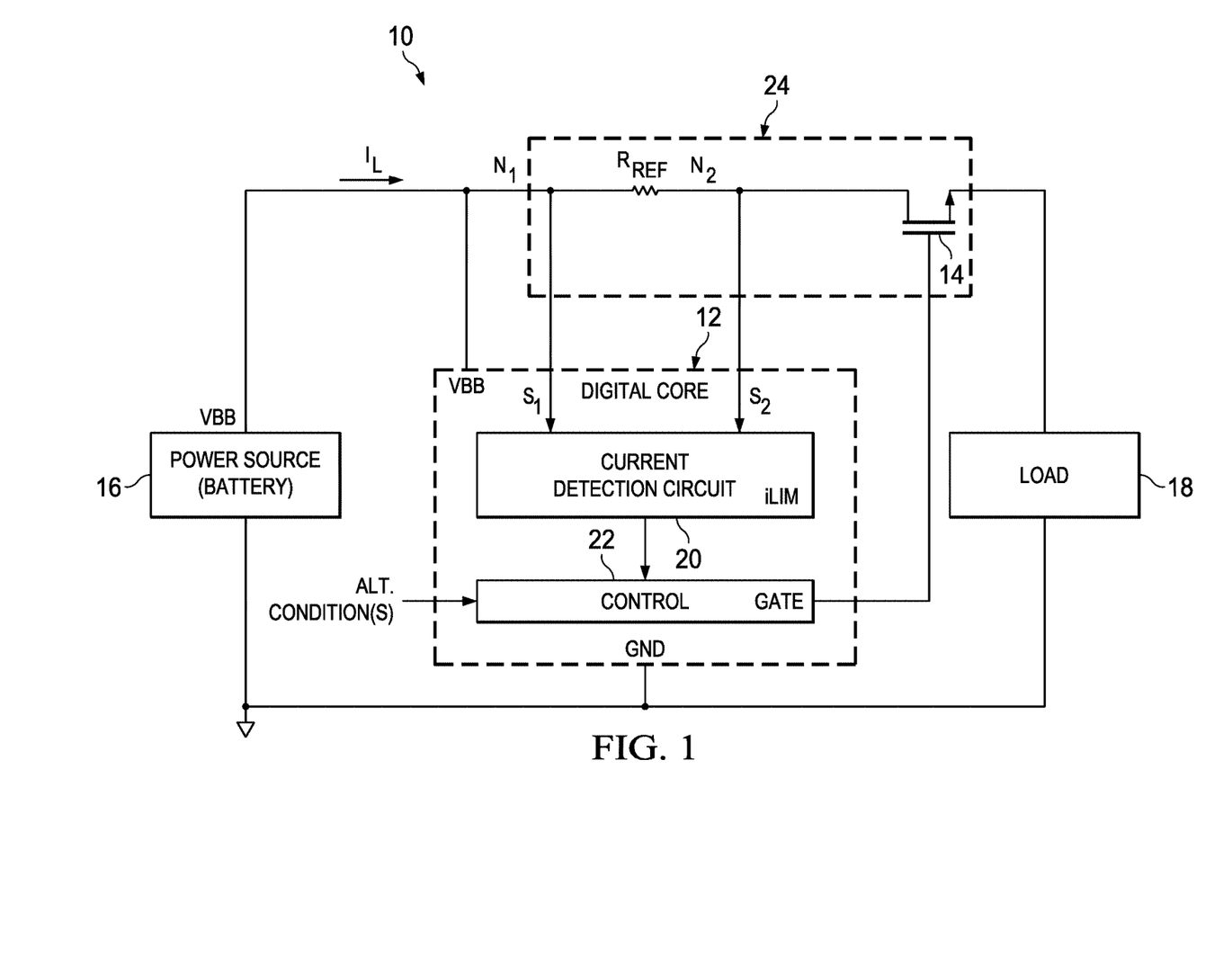
FIG. 1 illustrates a preferred embodiment system 10 for controlling the supply of power and with a current limit trim determined using lower current than the limit indicated by the trim.

FIG. 1 illustrates a system 10 that in some general respects illustrates a controlled power delivery according to the prior art, but as is improved with aspects described in greater detail in this document. By way of the introduction, therefore, a general overview is presented in connection with FIG. 1, and preferred embodiment aspects are explained thereafter. System 10 includes a digital core 12, which may be constructed of various devices so as to achieve the functionality described below. For example, digital core 12 may be implemented as part of a processor (including appropriate programming) or as an integrated circuit module, akin in some respects to commercially available power controllers that are used in connection with thermal, current, or power detection of an associated power transistor 14, such as an n-channel MOSFET. One contemporary example for such a power controller is the TPS2482 sold by Texas Instruments Incorporated, so the functionality of that device may be further augmented by including additional circuitry and control to accomplish the operational aspects described herein. Additionally, one contemporary example for power transistor 14 integrated in a package that may include features, as further detailed below, is available as a NEXFET Power MOSFET package, commercially available from Texas Instruments Incorporated.

Looking to device connectivity in FIG. 1, digital core 12 is powered between a DC reference voltage VBB from a power source 16 and ground. The reference supply voltage is identified by the convention of VBB as if a battery power provides the voltage, such as would be the case in a vehicle application of system 10. In alternative preferred embodiments, however, a power source other than a battery may be implemented. Digital core 12 is connected as detailed below to power transistor 14 for sensing current through that device and selectively enabling its gate to turn on or off the transistor. Further, power source 16 is connected through a reference resistor $R_{REF}$ and through the source/drain path of transistor 14 to a load 18, where, for example, load 18 may be, or include, various devices. For example, and as introduced earlier in the Background of the Invention section of this document, load 18 may include an incandescent bulb, which can have high current needs during in-rush conditions and where such high current requires accurate limitation. Thus, a preferred embodiment is particularly well-suited for, and/or to include, such a load and for the power FET driving it.

In a preferred embodiment, digital core 12 preferably includes a current detection circuit 20. Current detection circuit 20 is connected to two digital core sensing inputs, a first $S_1$ for sensing the potential at a node $N_1$, which is connected between power source 16 and a first terminal of resistor $R_{REF}$, and a second $S_2$ for sensing the potential at a node $N_2$, which is connected between a second terminal of resistor $R_{REF}$ and the drain of transistor 14. Current detection circuit 20 is operable to evaluate a measure of current $I_L$ through resistor $R_{REF}$ (e.g., as sensed between inputs $S_1$ and $S_2$)—in this regard, in a preferred embodiment and as detailed below, resistor $R_{REF}$ is integrated as part of an integrated circuit die 24 into which transistor 14 is formed and is actually the substrate resistance of that die. In any event, current detection circuit 20 is also operable to compare the measured current to a safe operating current threshold. In the event that threshold is exceeded, circuit 20 asserts an event output iLIM, so named to denote that current (designated by "i" before "LIM") has exceeded a given limit Further details for establishing the threshold limit and the comparison thereto are detailed later. In any event, the output iLIM is connected as an input to a control block 22, as further detailed below.

Control block 22 includes sufficient circuitry, such as a state machine, so as to respond to at least the iLIM input from current detection circuit 20 to selectively enable and disable transistor 14. Moreover, control block 22 is shown to include an ALT. CONDITION(S) input, which is intended to indicate that other alternative inputs also may be received by the block, so as also to affect the controlled operation of transistor 14. For example, a separate enable/disable signal may be input to block 22, so as to signal a condition that can result in the disabling of transistor 14. For example, other such conditions may include temperature sensing of the integrated circuit die 24 into which transistor 14 is formed, power or energy across transistor 14, as well as other signals (e.g., by a separate pin) for enabling/disabling transistor 14. In any event, in response to either iLIM or the ALT. CONDITION(S), control block 22 controls a GATE enable output, connected to a gate of power transistor 14. As a result, digital core 12 can selectively apply a gate bias to control, enable, or disable the current path through transistor 14, so as to reduce the possibility of potential damage to the power transistor based on excess current detected by current detection circuit 20. Additionally, control block 22 can likewise respond to signals or fault condition(s) indicated by the ALT. CONDITION(S). Thus, when control block 22 is so alerted, it may selectively assert or de-assert its GATE control to turn on/off transistor 14, or otherwise control the amount of current flow through transistor 14, in response to these conditions.

The operation of system 10 is now introduced, and is further detailed in the remainder of this document. In general, when transistor 14 is enabled, it sources current $I_L$ to load 18. In the case where load 18 is, for example, an incandescent bulb, then in proper operation current $I_L$ will satisfy the load start-up requirements, such as a relatively large in-rush current needed for a cold start. Further, $I_L$ will thereafter satisfy the generally-static requirements of current for the bulb once its filament is heated. Also in this regard, however, current detection circuit 20 senses, via its sensing inputs $S_1$ and $S_2$ and as further detailed below, the current $I_L$ through transistor 14 when that transistor is enabled. The sensed current is compared against a threshold, and as also detailed later that threshold is accurately indicated, preferably in response to a digital trim value ILIMIT_LVL, so as to determine if $I_L$ exceeds a value corresponding to ILIMIT_LVL. In response to detecting an unsafe current magnitude, that is, if $I_L$ exceeds the current limit set by ILIMIT_LVL, then iLIM is asserted to control block 22. In response, control block 22 can control the GATE signal so as to provide protection to transistor 14 (or load 18) from excessive current. For example, control block 22 may disable the GATE output, thereby disabling transistor 14 for a period of time, at least until the iLIM signal is no longer asserted by circuit 20. Additional delay past the assertion of iLIM also may be used to delay the retry of the GATE enabling signal, such as in response to time or some other safe operating region measure, including for example until thermal or energy considerations associated with transistor 14 have abated. These operations, therefore, seek to keep the stress and potential damage to transistor 14 within safe boundaries, while still permitting satisfactory operation of load 18.

Figure 2:
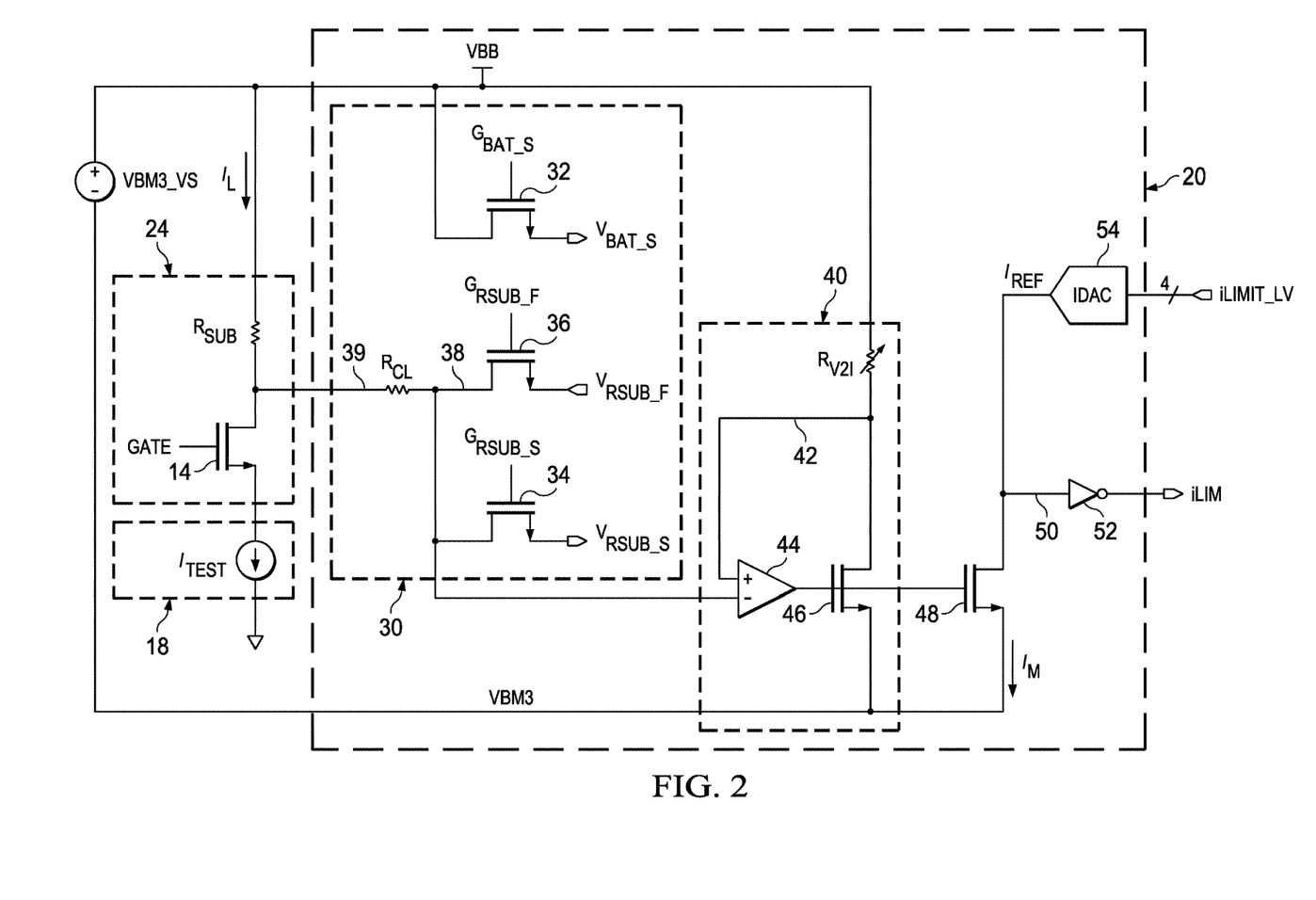
FIG. 2 illustrates a combined electrical block and schematic diagram of certain aspects of current detection circuit 20 from FIG. 1.

FIG. 2 illustrates a combined electrical block and schematic diagram of certain aspects of current detection circuit 20 in greater detail. Also in FIG. 2, circuit 20 is connected to integrated circuit die 24, which includes transistor 14. Note also that die 24 is shown to include a substrate resistance $R_{SUB}$ which, as detailed below, is a distributed resistance throughout the substrate of the die; hence, in reference to FIGS. 1 and 2, together, note that the reference resistor $R_{REF}$ in FIG. 1 is, in FIG. 2, the substrate resistance $R_{SUB}$. As detailed below, therefore, during device testing, current detection circuit 20 is operable to establish a threshold limit ILIMIT_LVL, so as to later determine if, under normal operations, $I_L$, through the substrate resistance $R_{SUB}$ and as provided to load 18, exceeds the current limit set by ILIMIT_LVL. Further in this regard, in FIG. 2, load 18 from FIG. 1 is shown, for device set-up purposes, as a precision reference current source. This current source provides a current $I_{TEST}$, for purposes of identifying the proper trim level for the threshold limit ILIMIT_LVL. Note that current $I_{TEST}$ is preferably considerably less, even by orders of magnitude (i.e., factors often), than the nominal or maximum drain-to-source operation current of transistor 14 when it is connected to load 18. For example, $I_{TEST}$ may be in the range of milliamps (e.g., 200 mA to 400 mA), whereas the operational current can reach up to the limit of 90 A. Later however, and once the proper operability of circuit 20 is established, the source of transistor 14 is instead connected to drive an alternative load 18, as was shown in FIG. 1.

In a preferred embodiment, current detection circuit 20 includes a test multiplexer circuit 30 that includes three transistors 32, 34, and 36, where each such transistor has a pad that may be biased or sensed, as well as a respective gate connection, all for connecting to test equipment, such as automatic test equipment (ATE), in connection with the manufacture, testing, and calibration of the current limit for circuit 20. The source/drain path through transistors 32 and 34 allow for sensing voltages, while the source/drain path of transistor 36 allow forcing (i.e., applying) a test voltage. More particularly, NMOS transistor 32 has its drain connected to receive VBB and its gate is connected to receive a control signal $G_{BAT\_S}$. Thus, when control signal $G_{BAT\_S}$ is asserted high, the source of NMOS transistor 32 provides a signal pad for sensing the voltage $V_{BAT\_S}$ resulting from battery voltage VBB (and corresponding to node $N_1$ in FIG. 1) and the drain of NMOS transistor 32. NMOS transistor 34 has its drain connected to a node 38, which is further connected through a current limiting resistor $R_{CL}$ (e.g., 5 k to 10 k Ohms) to a node 39, which is connected to the drain of transistor 14. The substrate resistance $R_{SUB}$, therefore, is connected between node 39 and VBB (and node 39 corresponds to node $N_2$ in FIG. 1). NMOS transistor 34 is also connected to receive at its gate a control signal $G_{RSUB\_S}$. Thus, when control signal $G_{RSUB\_S}$ is asserted high, the source of NMOS transistor 32 provides a signal pad with a voltage $V_{RSUB\_S}$, that is, for sensing the voltage connected at node 38 to the drain of the transistor. NMOS transistor 36 has its drain also connected to node 38, and transistor 36 is also connected to receive at its gate a control signal $G_{RSUB\_F}$. When control signal $G_{RSUB\_F}$ is asserted high, a pad at the source of NMOS transistor 36 is to receive a signal $V_{RSUB\_F}$ for applying a voltage to node 38.

Also in a preferred embodiment, current detection circuit 20 includes a voltage to current (V2I) amplifier circuit 40. V2I amplifier circuit 40 includes a resistor RV2I, which may have a variable tuning aspect (e.g., by digital tuning), connected between VBB and a node 42, although note that this variability can be to support other system aspects beyond the scope of the present discussion, so such variability is optional in connection with a preferred embodiment. Node 42 is also connected to the non-inverting input of an amplifier 44, while the inverting input to amplifier 44 is connected to node 38 of test multiplexer circuit 30. The output of amplifier 44 is connected to a gate of an NMOS transistor 46. The drain of NMOS transistor 46 is connected to node 42, and the source of NMOS transistor 46 is connected to a node VBM3. Node VBM3 is a regulated voltage node kept at a voltage VBM3_VS (e.g., 3.5 V) below VBB. Lastly, while not shown, an additional resistor may be connected between node 42 and the drain of NMOS transistor 46. In any event, one skilled in the art will appreciate that V2I amplifier circuit 40 is configured in a feedback arrangement which will tend, in operation, to bring the potential at the inverting and non-inverting inputs to amplifier 40 to an equal value.

Completing the discussion of the connections in FIG. 2, the output of amplifier 44 is also connected to the gate of an NMOS transistor 48, and the source of NMOS transistor 48 is connected to node VBM3. Thus, NMOS transistor 48 provides a mirrored current $I_M$ through its source, mirroring the current through the source of NMOS transistor 46. The drain of NMOS transistor 48 is connected to a node 50. Node 50 connected to an input of an inverter 52, where the output of inverter 52 provides the iLIM signal introduced above in connection with FIG. 1. Node 50 is also connected to an output of a digital to analog converter IDAC 54, which receives as a digital input a multi-bit (e.g., 4 bits) input and converts that to an analog current, $I_{REF}$, so as to adjust the threshold at which current detection circuit 20 changes the state of iLIM, as further appreciated below.

Figure 3:
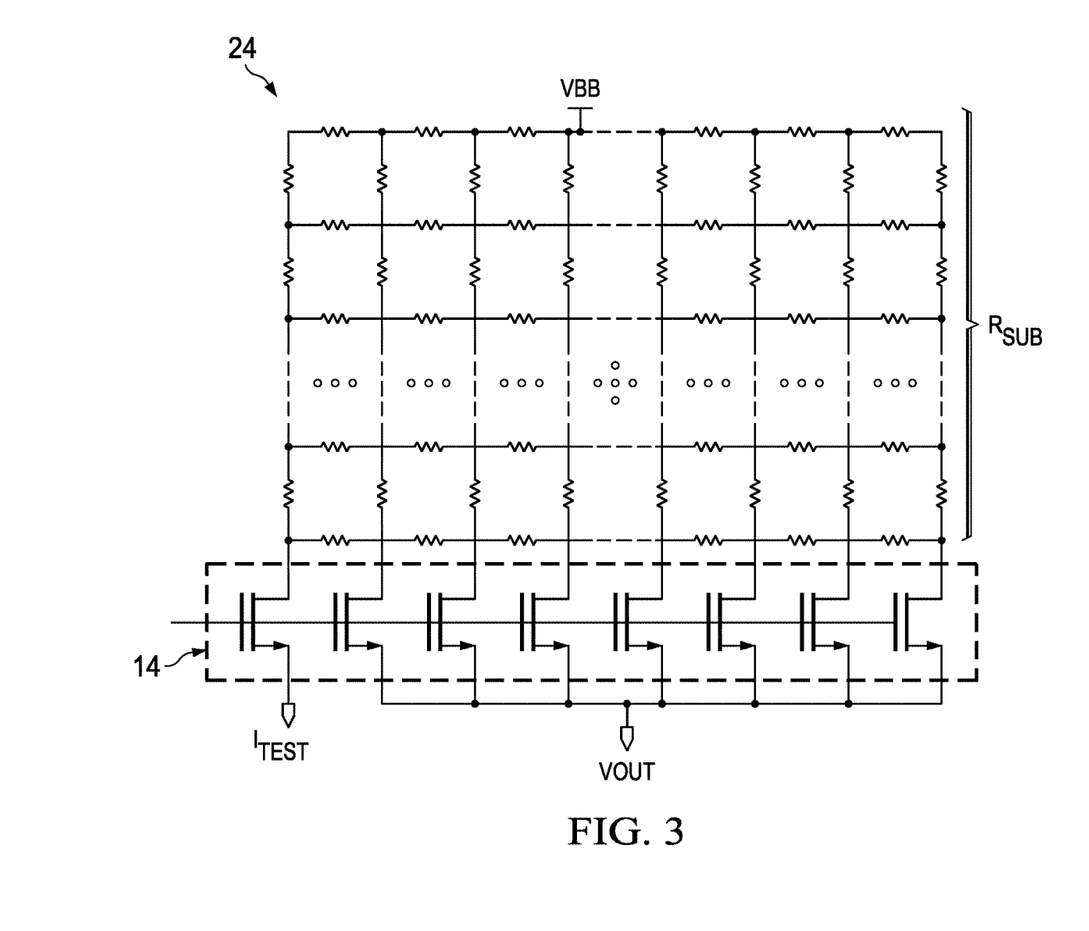
FIG. 3 illustrates additional electrical attributes of integrated circuit die 24 of FIG. 1.

FIG. 3 illustrates additional electrical attributes of integrated circuit die 24, as further context for a later description of a preferred embodiment methodology involving the detailed testing, operation, and calibration of current detection circuit 20 from FIG. 2. In a preferred embodiment, integrated circuit die 24 is a single module with its own device substrate into which various layers are fabricated so as to create the above introduced transistor 14. In more detail, FIG. 3 illustrates that transistor 14 is actually manufactured as a number of transistor devices (defined by respective transistor gates), all of which share the substrate as the drain for each transistor device. As a result, the substrate resistance, $R_{SUB}$, creates a distributed resistance through the substrate as shown in FIG. 3 as a generalized network of resistive elements. Moreover, and consistent with FIGS. 1 and 2, the substrate resistance $R_{SUB}$ is connected between VBB and the transistor drain. As a result, note that the value of $R_{SUB}$ can vary from device to device, due to process variations and the like. Indeed, a preferred embodiment methodology described below is directed, in part, to properly calibrating current control in view of the potential variations of $R_{SUB}$ as between devices. In any event, completing the description of FIG. 3, note that the sources of numerous transistors that form transistor 14 are connected together to provide a pad VOUT, while a separate source of at least one of those forming transistors provides a pad to which $I_{TEST}$ may be coupled, where $I_{TEST}$ was introduced above in FIG. 2 and where its functionality is further detailed below.

Figure 4:
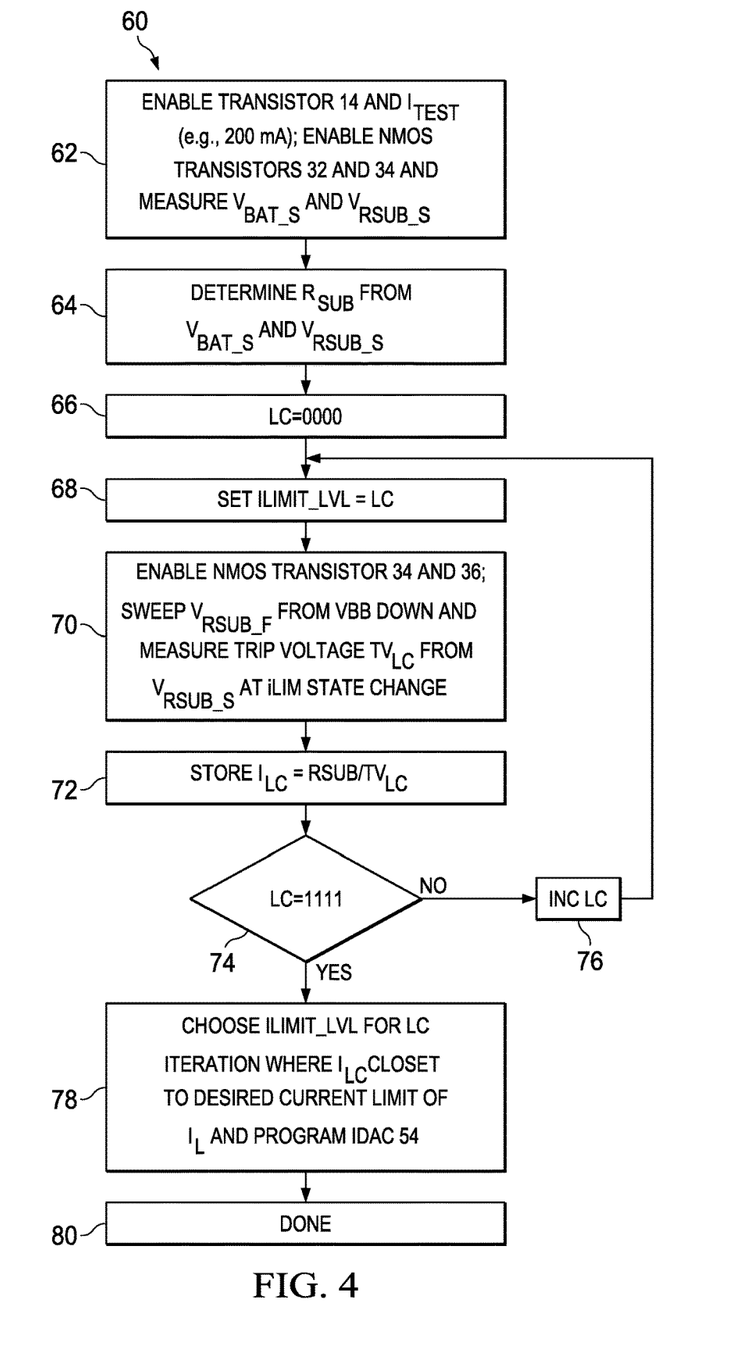
FIG. 4 illustrates a flowchart of a preferred embodiment methodology 60 in connection with the testing of circuit 20 so as to determine an optimum value of ILIMIT_LV according to the subsequent specifications (or customer needs) for system 10 of FIG. 1.

FIG. 4 illustrates a flowchart of a preferred embodiment methodology 60 in connection with the testing of circuit 20 so as to determine an optimum value of ILIMIT_LV according to the specifications (or customer needs) for implementing in a system, such as system 10 of FIG. 1. For example, assume that system 10 is to operate at a current limit of 90 A. As demonstrated in the remaining discussion, method 60 provides a preferred embodiment for determining the value of ILIMIT_LV that will most closely provide that desired limit In this regard, current detection circuit 20 is coupled to appropriate automatic test equipment (ATE) for: (i) coupling the transistor 14 source to the regulated current $I_{TEST}$; (ii) controlling multiplexer circuit 30 and either sensing or forcing voltages related to it; (iii) temporarily adjusting ILIMIT_LV among its different possible 4-bit values; and (iv) monitoring the iLIM event signal which, as demonstrated below, changes state when the drain-to-source current ($I_{DS}$) of transistor 14 exceeds a limit established by ILIMIT_LV. Each of these various aspects is further appreciated below.

Method 60 starts with step 62, in which transistor 14 is enabled (by asserting a signal to its gate), and at the same time $I_{TEST}$ is enabled so as to provide that current (e.g., 200 mA) as the $I_{DS}$ for transistor 14. Also during step 62, NMOS transistors 32 and 34 are enabled. With respect to NMOS transistor 32, its source node voltage, $V_{BAT\_S}$ is measured and may be optionally stored. And, with respect to NMOS transistor 34, as its source node is terminated into a high impedance, no current flows through resistor $R_{CL}$ and, hence, a voltage at both nodes 38 and 39 is measured as the voltage $V_{RSUB\_S}$. Next, method 60 continues to step 64.

In step 64, the two voltage measures from step 62, along with the known $I_{DS}$ current value of $I_{TEST}$, are used to determine the substrate resistance $R_{SUB}$. More particularly, the determination may be made from the following Equation 1:

$$R_{SUB} = \frac{V_{BAT\_S} - V_{RSUB\_S}}{I_{TEST}} \qquad \text{Equation 1}$$

Equation 1 is readily understood by one skilled in the art and represents a true Kelvin measure of the voltage drop across the substrate resistance $R_{SUB}$. Thus, where FIG. 3 and its corresponding discussion above demonstrates the complexity and general unknowability of the distributed resistance across the substrate of integrated circuit die 24 and its transistor 14, method 60 and the associated apparatus and steps 62 and 64, along with Equation 1, provide a measure for $R_{SUB}$. This measure is optionally stored and in any event usable in connection with further precision setting of ILIM-IT_LVL, as further described below. Next, method 60 continues to step 66.

In step 66, a loop counter LC is initialized to a value of zero. As detailed below, loop counter LC is used as a control and index to iteratively loop the 4-bit value ILIMIT_LVL through its various different values (i.e., 0000, 0001, . . ., 1110, 1111) so as to converge on an optimal value corresponding to the desired current limit to be indicated by that value. Thus, step 66 represents an initialization for the first loop of the iterative process, and for sake of explanation the index and incrementing value of loop counter LC is described in 4-bit binary fashion. Next, method 60 continues to step 68.

In step 68, the value of value ILIMIT_LVL is set to match that of the loop counter LC. Thus, for the first loop of the multiple iterations of method 60, wherein LC=0000, then likewise ILIMIT_LVL=0000. Next, method 60 continues to step 70.

In step 70, NMOS transistors 34 and 36 are enabled; note during step 70, enablement/operation of transistor 14 is optional, as the bias and evaluation during this step is directed to test multiplexer circuit 30, V2I amplifier circuit 40, and the devices connected to node 50. With NMOS transistor 36 enabled, the pad voltage $V_{RSUB\_F}$ is swept from VBB down, thereby applying a decreasing voltage to node 38. At the same time, the iLIM signal output by inverter 52 is monitored until it switches state from low to high. More particularly, note that the decreasing (swept) voltage at node 38 is input to the inverting input of amplifier 44, and due to the negative feedback connectivity of that amplifier, the voltage at node 42, that is, to the non-inverting input, will tend toward matching that at node 38 (i.e., at its inverting input). Thus, the voltage at node 42 will decrease with the downward sweeping voltage from $V_{RSUB\_F}$, thereby increasing the voltage drop across resistor $R_{V2I}$ and increasing the current through it. At the same time, the increasing current through resistor $R_{V2I}$ is mirrored through NMOS transistor 48, thereby increasing the sinking of current from node 50. Also at the same time, IDAC 54 sources current $I_{REF}$ to node 50 in response to the setting of ILIMIT_LV, which for the first loop in the iterations will be a relatively low value because ILIMIT_LV=0000. As a result of the preceding, when the downward sweeping voltage from $V_{RSUB\_F}$ causes a current through NMOS transistor 48 that exceeds $I_{REF}$, node 50 is pulled to a logical low value (i.e., VBM3) and the output of inverter 52, as indicated by the signal iLIM, transition from low to high; hence, the circuitry coupled to node 50 provides a comparison of the sourced current $I_{REF}$ from IDAC 54 and the mirrored current $I_M$, as a transition from low to high occurs when $I_M > I_{REF}$. When this transition occurs, and with NMOS transistor 34 also enabled, the then-existing voltage at node 38 is sensed for the present instance of step 70. This sensed voltage is referred to herein as a trip voltage TV, as it represents the amplifier input voltage sufficient to trip the state transition for iLIM. For sake of reference, because each instance of step 70 is associated with a different index value for the loop counter LC, then a particular instance of step 70 measures a present trip voltage indicated as $TV_{LC}$. Hence, for the first iteration of step 70, the trip voltage can be indicated as $TV_{0000}$. Also in connection with the measure of $TV_{LC}$, note that while node 38 is connected to the drain of both NMOS transistors 36 and 34, various attributes of NMOS transistor 36 (e.g., resistance) as well as its circuit connectivity will cause some voltage loss across it, so the trip voltage $TV_{LC}$ at node 38, as sensed by NMOS transistor 34 as $V_{RSUB\_S}$, will be slightly lower than the forced voltage $V_{RSUB\_F}$. Thus, NMOS transistor 34 during step 70 permits an accurate measure of the node 38 trip voltage $TV_{LC}$. Also in connection with step 70, note that the inclusion of current limiting resistor $R_{CL}$, with its relatively large resistance as compared to an approximate nominal or expected resistance of $R_{SUB}$, will thereby limit current flow through $R_{SUB}$ and thereby protect transistor 14 during the step. Next, method 60 continues to step 72.

In step 72, a current value $I_{LC}$, for the present instance of loop counter LC, is determined and stored. More particularly, current value $I_{LC}$ is determined according to the following Equation 2:

$$I_{LC} = \frac{TV_{LC}}{R_{SUB}} \qquad \text{Equation 2}$$

Equation 2 indicates that that the determined current value $I_{LC}$ is the current that would be expected to flow when the trip voltage $TV_{LC}$ occurs across resistor $R_{SUB}$; in other words, $I_{LC}$ is the expected drain-to-source current under normal operations when transistor 14 is enabled and a load 18 is applied to it, shown in FIGS. 1 and 2 as $I_L$. By way of numeric example, assume for the iteration loop of LC=0000, that $TV_{0000}=1$ mV, and assume also from step 64 it was determined that $R_{SUB}=1$ Milliohm. Substituting these values into Equation 2 gives the following Equation 2.1:

$$I_{LC} = \frac{TV_{LC}}{R_{SUB}} = \frac{1(10)^{-3}}{1(10)^{-3}} = 1 \text{ Amp} \qquad \text{Equation 2.1}$$

Thus, for a first iteration loop, wherein LC=ILIMIT_LVL=0000, then a measured trip voltage of $TV_{LC}=1$ mV would correspond to 1 Amp of current, $I_L$, through transistor 14, under normal operations of driving a load 18. In other words, step 72 thereby concludes that the present setting of ILIMIT_LVL=0000 would result in a current limitation through $R_{SUB}$ of only 1 Amp, whereas the goal in the present example is a limit of 90 Amps. Further loop iterations of method 60, however, will change ILIMIT_LVL and eventually identify the value of ILIMIT_LVL that provides a closer trim to the goal of 90 Amps, as further appreciated below. In this regard, method 60 continues to step 74.

In step 74 the loop counter is compared to a value (e.g., its maximum) to determine if a sufficient number of loop iterations have occurred, each for a different index of the value of LC, so as to converge on an optimum value of ILIMIT_LVL that will provide a closest trim to a particular specification (e.g., of 90 Amps). As one preferred embodiment example, in method 60, the condition of step 74 determines whether the present value of LC has reached the maximum binary value of 1111. If the condition is not yet met, then method 60 continues to step 76 so as to increment the loop counter LC and return to step 68 for another iteration loop using the incremented LC value. If the step 74 condition is met, then method 60 continues to step 78. Each of these possible paths from step 74 is further explored below.

When the condition of step 74 is not met, then as indicated above, and as shown in FIG. 4, step 76 increments the loop counter LC and the method flow returns to step 68 for another iteration loop of steps 68 through 74 at the new loop counter value. For example, where loop counter LC was formerly a value of 0000 for the immediately preceding loop of steps 68 through 74, then a next iteration of those steps occurs for loop counter LC=0001. At this new value, therefore, step 68 sets the trim value ILIMIT_LV to 0001, thereby causing a larger current $I_{REF}$ to be sourced into node 50, as compared to that for the prior iteration wherein ILIM-IT_LV=0000. Again, NMOS transistors 34 and 36 are enabled, $V_{RSUB\_F}$ is swept downward from VBB, and the trip voltage $TV_{0001}$ is sensed via the pad voltage $V_{RSUB\_S}$ when iLIM transitions from low to high. For this second iteration, therefore, assume by way of example that for the iteration loop of LC=0000, that $TV_{0001}$=10 mV, continuing also with the example wherein the earlier step 64 determined that $R_{SUB}$=1 Milliohm. Substituting these values into Equation 2 gives the following Equation 2.2:

$$I_{LC} = \frac{TV_{LC}}{R_{SUB}} = \frac{10(10)^{-3}}{1(10)^{-3}} = 10 \text{ A (Amps)} \qquad \text{Equation 2.2}$$

Thus, for a second loop, wherein LC=ILIMIT_LVL=0001, then a measured trip voltage of $TV_{0001}$=10 mV would correspond to a 10 A current, $I_L$, through transistor 14, under normal operations of driving a load 18. In other words, step 72 thereby concludes that the present setting of ILIM-IT_LVL=0010 would result in a current limitation through $R_{SUB}$ of only 10 Amps. Moreover, because LC=0001, then the next instance of step 74 causes another increment of LC (i.e., to 0010), and the above set of steps 68 through 74 repeat for numerous additional loops, until all LC=1111 instances of the iterative loop have occurred. Once that occurs, method 60 continues to step 78.

In step 78, method 60 identifies the value of $I_{LC}$, among the 1111 binary stored values of $I_{LC}$, that corresponds to a value closest to the desired current limit for system 10. For example, assume that the following Table 1 illustrates each instance of loop counter LC from 0000 to 1111, with the corresponding values found for $TV_{LC}$ and $I_{LC}$, starting with the two examples discussed above and continuing as shown in the Table:

TABLE 1

| LC | $TV_{LC}$ | $I_{LC}$ |
|---|---|---|
| 0000 | $1(10)^{-3}$ | 1 A |
| 0001 | $10(10)^{-3}$ | 10 A |
| 0010 | $19(10)^{-3}$ | 19 A |
| 0011 | $28(10)^{-3}$ | 28 A |
| 0100 | $37(10)^{-3}$ | 37 A |
| 0101 | $46(10)^{-3}$ | 46 A |
| 0110 | $55(10)^{-3}$ | 55 A |
| 0111 | $64(10)^{-3}$ | 64 A |
| 1000 | $73(10)^{-3}$ | 73 A |
| 1001 | $82(10)^{-3}$ | 82 A |
| 1010 | $91(10)^{-3}$ | 91 A |
| 1011 | $100(10)^{-3}$ | 100 A |
| 1100 | $109(10)^{-3}$ | 109 A |
| 1101 | $118(10)^{-3}$ | 118 A |
| 1110 | $127(10)^{-3}$ | 127 A |
| 1111 | $136(10)^{-3}$ | 136 A |

Given the values in Table 1, the entry having a corresponding value of $I_{LC}$ closest to the example limit of 90 A is identified, which given the hypothetical example numbers is that for the loop counter instance of LC=1010 Thus, step 78 identifies that entry, and step 78 further chooses the corresponding trim value of ILIMIT_LV=1010 for that entry, as that trim value will be expected to limit current $I_L$ through transistor 14 to approximately 90 A. Step 78 further programs IDAC 54 with the chosen value of ILIMIT_LV (e.g., of 1010), such as by burning fuses or otherwise using connections to the IDAC so as to hardwire or preferably permanently input that value to the IDAC. The result of this programming may be appreciated by returning to FIGS. 1 and 2. Specifically, note that when transistor 14 is driving a load 18 as in FIG. 1, and when $I_L$ is approximately 91 A, with $R_{SUB}$ now having been determined to be 1 Milliohn, then the voltage across resistor $R_{SUB}$ and hence to node 38 and the inverting input of amplifier 44 will be the same as the trip voltage $TV_{LC}$ was when applied to node 38 and determined in method 60 (i.e., which during method 60 that caused the transition of iLIM from low to high for the programmed value of ILIMIT_LV=1010). Hence, during later normal operations of system 10 so as to drive a load 18, then an actual flow of current $I_L$ at the same level likewise should cause the iLIM transition from low to high. Thus, once the proper value of ILIMIT_LV is programmed, IDAC 54 will supply current $I_{REF}$ consistent with the programmed value, and during normal operations when the drain-to-source current $I_L$ through transistor 14 reaches 91 A, iLIM will transition from low to high, thereby facilitating a proper protective response consistent with FIG. 1. Having described method 60, note that alternative preferred embodiments may use alternative conditions for step 74 or otherwise limit the number of iteration loops in some fashion. For example, if a certain expected value of ILIMIT_LVL might be predicted to be that which is expected to achieve the desired current limit, then instead of attempting a loop for all LC=1111 possibilities, the loop counter (or some other index) might be reduced to narrow the trial and error process to a reduce number of loops, for example with a plus or minus number of possibilities centered about the expected value. As another example, method 60 could commence with the expected value of ILIMIT_LVL, measure $V_{RSUB\_S}$ at that value and determine the corresponding current $I_{LC}$, and then either selectively increase or decrease the value of ILIMIT_LVL based on whether the determined value of $I_{LC}$ at the expected value of was too low or too high, respectively. Still other alternatives may be ascertained by one skilled in the art.

Given the preceding, the preferred embodiments provide an improved power driving system, including a multiple module circuit architecture for calibrating a current limit trim using a test current that is significantly lower than the actual current limit intended for the circuit architecture. Numerous benefits arise from the preferred embodiments, and still others may be ascertained by one skilled in the art. For example, for calibrating a preferred embodiment, no high-current test hardware is required; lower currents, such as 200 mA to 400 mA, are sufficient to achieve accurate trim level for operational currents $I_L$ of 100 A or higher. Thus, the preferred embodiments eliminate any need for a high (e.g., 90 A to 100 A) current test reference (e.g., such as via 40 A sources), saving cost in hardware/source and avoiding practical issues due to the requirement that such high currents should not be applied on the device for long durations (safe operating area concerns). Another benefit is that reliability is improved by avoiding high-current stress to device in ATE. Moreover, part-to-part production scale multiple control module (MCM) current-limit trim is viable and, therefore, overall current-limit specifications can be defined tight to improve competitiveness. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A system, comprising:
a substrate having a supply voltage input, a substrate resistance, a transistor formed in the substrate, and a regulated voltage output coupled in series, the transistor including a drain coupled to the substrate resistance, a source, and a gate; and
test circuitry including:
an operational voltage input coupled to between the substrate resistance and the drain;
forcing circuitry having an output coupled to the operational voltage input, the forcing circuitry adapted to apply a forced voltage at the operational voltage input;
voltage to current circuitry having an input coupled to the operational voltage input and having a reference current output, the voltage to current circuitry adapted to output a reference current on the reference current output in response to the forced voltage;
trim current circuitry having a trim current output coupled to the reference current output, the trim current circuitry adapted to provide a trim current on the trim current output in response to a received trim indicator; and
comparison circuitry having an input coupled to the reference current output and the trim current output and having a limit output, the comparison circuitry adapted to output a limit signal on the limit output in response to the reference current and the trim current.

2. The system of claim 1 in which the test circuitry includes:
current source circuitry coupled to the regulated voltage output for enabling a predetermined current through a source-to-drain path of the transistor; and
difference circuitry coupled to the supply voltage input and the drain for measuring a voltage difference across the substrate resistance.

3. The system of claim 2 in which the substrate resistance of the substrate equals the voltage difference across the substrate resistance divided by the predetermined current.

4. The system of claim 2 in which the predetermined current is at least one order of magnitude less than an operational current limit through a source-to-drain path of the transistor.

5. The system of claim 2 in which the predetermined current is at least two orders of magnitude less than an operational current limit through a source-to-drain path of the transistor.

6. The system of claim 1 and including trip circuitry coupled to an input of the voltage-to-current circuitry for determining a trip voltage at which the comparison circuitry changes a state of the limit signal.

7. The system of claim 6 in which the trim indicator is set in response to the trip voltage.

8. The system of claim 6 in which the test circuitry includes:
iteration circuitry coupled to the trim current circuitry for iteratively applying a plurality of different trim indicators; and
measuring circuitry coupled to the trip circuitry for measuring a respective trip voltage corresponding to each trim indicator in the plurality of trim indicators.

9. The system of claim 8 in which the test circuitry includes:
final trim circuitry coupled to the limit output for selecting a final trim indicator in response to a respective ratio of each respective trip voltage divided by the substrate resistance.

10. The system of claim 9 in which the test circuitry includes programming circuitry coupled to the trim current circuitry for programming the final trim indicator to the circuitry for providing a reference trim current.

11. The system of claim 8 in which the measuring circuitry for measuring a respective trip voltage further includes circuitry for sweeping across a voltage range that includes the trip voltage.

12. The system of claim 1 and further including a load driven by the transistor.

13. A circuit protective system, comprising:
an input adapted to be coupled to between a drain of a transistor and a substrate resistance;
a node coupled to the input;
a first transistor having a source/drain path coupled to the node and that senses an operational voltage responsive to a current flowing through the transistor;
a second transistor having a source/drain path couple to the node and that selectively applies a forced voltage to the node;
voltage-to-current conversion circuitry including an amplifier with an input coupled to the node and an amplifier output, the amplifier outputs a reference current on the amplifer output in response to the forced voltage at the node;
trim circuitry that provides a reference trim current on a trim output in response to receiving a trim indicator; and
comparison circuitry having inputs coupled to the trim output and to the amplifier output and that outputs a limit signal on a limit output in response to a comparison of the reference current and the reference trim current.

14. The system of claim 13 in which the trim circuitry includes a digital to analog converter that receives the trim indicator as an input and that outputs the reference trim current.

15. The system of claim 13 including test circuitry coupled to the input for determining a substrate resistance of the substrate.

16. A method of determining a current trim indicator for a circuit protective system that includes a transistor with a substrate resistance and a circuit responsive to a trip voltage, the method comprising:
determining the substrate resistance;
iteratively applying a plurality of different trim indicators to the circuit protective system;
determining a respective trip voltage corresponding to each trim indicator in the plurality of trim indicators; and
selecting a final trim indicator from the plurality of trim indicators, in which the final trim indicator corresponds to a predetermined current limit represented by a ratio of a trip voltage divided by the substrate resistance.

17. The method of claim 16 in which:
the step of determining the substrate resistance includes enabling a predetermined current through a source-to-drain path of the transistor; and in which the predetermined current is at least one order of magnitude less than an operational current limit through a source-to-drain path of the transistor.

18. The method of claim 16 in which:

the step of determining the substrate resistance includes enabling a predetermined current through a source-to-drain path of the transistor; and in which the predetermined current is at least two orders of magnitude less than an operational current limit through a source-to-drain path of the transistor.

* * * * *